US006934648B2

(12) United States Patent
Hanai et al.

(10) Patent No.: US 6,934,648 B2
(45) Date of Patent: Aug. 23, 2005

(54) JITTER MEASUREMENT CIRCUIT FOR MEASURING JITTER OF MEASUREMENT TARGET SIGNAL ON THE BASIS OF SAMPLING DATA STRING OBTAINED BY USING IDEAL CYCLIC SIGNAL

(75) Inventors: Hisayoshi Hanai, Hyogo (JP); Teruhiko Funakura, Hyogo (JP); Hisaya Mori, Hyogo (JP)

(73) Assignees: Renesas Technology Corp., Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 195 days.

(21) Appl. No.: 10/364,500

(22) Filed: Feb. 12, 2003

(65) Prior Publication Data

US 2004/0044488 A1 Mar. 4, 2004

(30) Foreign Application Priority Data

Aug. 30, 2002 (JP) ...................................... 2002-254749

(51) Int. Cl.[7] .......................... G06F 19/00; H04B 17/00
(52) U.S. Cl. .......................................... 702/69; 375/226
(58) Field of Search ............................. 702/69, 72, 77, 702/79; 375/226, 224, 227; 324/76, 77

(56) References Cited

U.S. PATENT DOCUMENTS

| | | | | |
|---|---|---|---|---|
| 5,557,196 A | * 9/1996 | Ujiie | 324/76.77 |
| 6,167,359 A | * 12/2000 | Demir et al. | 702/191 |
| 6,240,130 B1 | * 5/2001 | Burns et al. | 375/226 |
| 6,356,850 B1 | * 3/2002 | Wilstrup et al. | 702/69 |
| 6,366,374 B2 | * 4/2002 | Bradshaw et al. | 398/17 |
| 6,460,001 B1 | * 10/2002 | Yamaguchi et al. | 702/69 |
| 6,519,281 B1 | * 2/2003 | Taylor | 375/226 |
| 6,525,523 B1 | * 2/2003 | Soma et al. | 324/76.77 |
| 6,598,004 B1 | * 7/2003 | Ishida et al. | 702/69 |
| 6,621,860 B1 | * 9/2003 | Yamaguchi et al. | 375/226 |
| 6,640,193 B2 | * 10/2003 | Kuyel | 702/69 |
| 6,735,538 B1 | * 5/2004 | Yamaguchi et al. | 702/69 |
| 6,775,321 B1 | * 8/2004 | Soma et al. | 375/226 |
| 2001/0037189 A1 | * 11/2001 | Unu et al. | 702/191 |
| 2002/0075951 A1 | * 6/2002 | Pearson | 375/226 |
| 2002/0103609 A1 | * 8/2002 | Kuyel | 702/69 |
| 2002/0136337 A1 | * 9/2002 | Chatterjee et al. | 375/355 |
| 2003/0125888 A1 | * 7/2003 | Yamaguchi et al. | 702/69 |
| 2003/0156673 A1 | * 8/2003 | Yanai | 375/371 |
| 2003/0202573 A1 | * 10/2003 | Yamaguchi et al. | 375/226 |
| 2003/0210029 A1 | * 11/2003 | Antheunisse et al. | 324/76.53 |
| 2003/0219086 A1 | * 11/2003 | LeCheminant et al. | 375/355 |
| 2004/0059524 A1 | * 3/2004 | Watson et al. | 702/45 |
| 2004/0061488 A1 | * 4/2004 | Rosenbaum et al. | 324/76.53 |
| 2004/0062301 A1 | * 4/2004 | Yamaguchi et al. | 375/226 |

FOREIGN PATENT DOCUMENTS

JP 2000-292469 10/2000

* cited by examiner

*Primary Examiner*—Patrick J. Assouad
(74) *Attorney, Agent, or Firm*—Leydig, Voit & Mayer, Ltd.

(57) ABSTRACT

A jitter measurement circuit includes: a conversion section sampling one of a reference signal and a measurement target signal in response to the other of the signals, thereby obtaining a sampling data string; and a determination section measuring jitter of the measurement target signal on the basis of the sampling data string obtained by the conversion section. Since the reference signal is a stable signal having a predetermined cycle, the sampling data string as a measurement result depends on the measurement target signal. Therefore, it is possible to simply measure jitter level in accordance with irregularity of the measurement result and on the basis of relative measurement to expected value data.

8 Claims, 11 Drawing Sheets

JITTER MEASUREMENT CIRCUIT FOR MEASURING JITTER OF MEASUREMENT TARGET SIGNAL ON THE BASIS OF SAMPLING DATA STRING OBTAINED BY USING IDEAL CYCLIC SIGNAL

BACKGROUND OF THE INVENTION

1. Field of the Invention

The present invention relates to a jitter measurement circuit which measures jitter included in a cyclic signal.

2. Description of the Background Art

In recent years, there are seen the acceleration of the main clock bus of a personal computer, the emergence of high-rate interfaces such as IEEE-1394 interface, the rapid rising of digital radio transmission such as cellular phones or radio LAN including the Bluetooth and the like. Following them, the potential needs of the measurement of jitter are generally rising.

There is known a jitter measurement method including quantizing a signal outputted from a measurement target object in the same cycle, and measuring the jitter of the signal in real time on the basis of the change of the quantized output data, as disclosed in Japanese Patent Laying-Open No. 2000-292469.

Meanwhile, as equipment for measuring such jitter, a time interval analyzer which has an analysis function of, for example, continuously, completely measuring the time intervals of measurement target signals to capture a large quantity of data and displaying a time interval histogram, and a spectrum analyzer, which analyzes the spectrum of a signal, as well as an analog tester which equally functions to these measuring equipment are employed. Recently, a mix signal tester which tests a digital/analog mixed IC in which digital signals and analog signals called mixed signals are used, i.e., a mixed device, and which functions equally to those described above, has appeared.

However, if a jitter measurement system is constructed with such measurement equipment or tester, it disadvantageously is expensive and takes a long time to construct. In addition, the tester having a jitter measurement function is disadvantageously expensive.

SUMMARY OF THE INVENTION

The present invention has been made to solve the above-described problems. It is an object of the present invention to provide a jitter measurement circuit which can easily realize jitter measurement at low cost.

A jitter measurement circuit according to one aspect of the present invention includes: a reference signal generation section generating a cyclic reference signal having a predetermined cycle; a conversion section sampling one of the reference signal and a cyclic measurement target signal outputted from a measurement target in response to the other one, thereby obtaining a sampling data string; and a determination section measuring jitter of the measurement target signal on the basis of the sampling data string obtained by the conversion section.

The jitter measurement circuit of the present invention includes: the conversion section sampling one of a reference signal and a measurement target signal in response to the other one, thereby obtaining a sampling data string; and a determination section measuring jitter of the measurement target signal on the basis of the sampling data string obtained by the conversion section. Since the reference signal is a stable signal having a predetermined cycle, the sampling data string as a measurement result depends on the measurement target signal. Therefore, a main advantage of the present invention is in that it is possible to simply measure jitter level in accordance with the irregularity of the measurement result and on the basis of relative measurement to expected value data.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
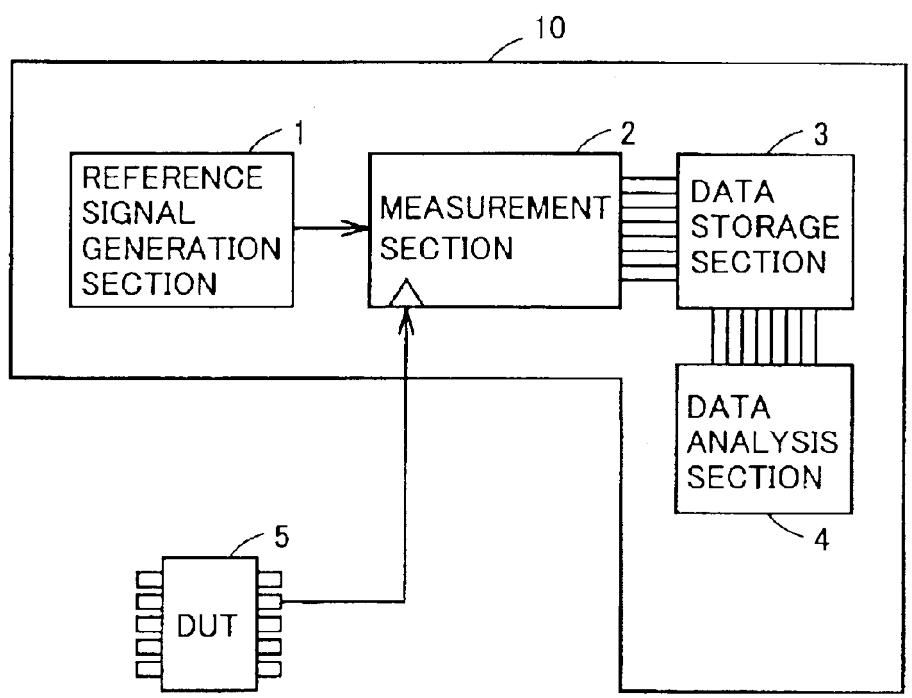
FIG. 1 is a conceptual view of a jitter measurement circuit and a measurement target device under test according to a first embodiment of the present invention.

Hereinafter, embodiments of the present invention will be described in detail with reference to the drawings. It is noted that the same or corresponding constituent elements are denoted by the same reference symbols, respectively in the drawings and that they will not be repeatedly described.

First Embodiment

With reference to FIG. 1, a jitter measurement circuit 10 according to a first embodiment of the present invention includes: a reference signal generation section 1 which generates a high purity cyclic signal, that is, a constant and ideal cyclic signal; a measurement section 2 which analog-to-digital converts the amplitude of the signal outputted from reference signal generation section 1 with high accuracy; a data storage section 3 which stores data; and a data analysis section 4 which calculates a jitter quantity on the basis of the data stored in data storage section 3. An example of the cyclic signal generated by reference signal generation section 1 can includes a sine wave. Further, measurement section 2 receives an input with a measurement clock signal outputted from a measurement target DUT (Device Unit Testing) 5 using as a sampling clock.

Using the flow chart of FIG. 2, the operation of jitter measurement circuit 10 according to the first embodiment of the present invention will be described.

Figure 2:
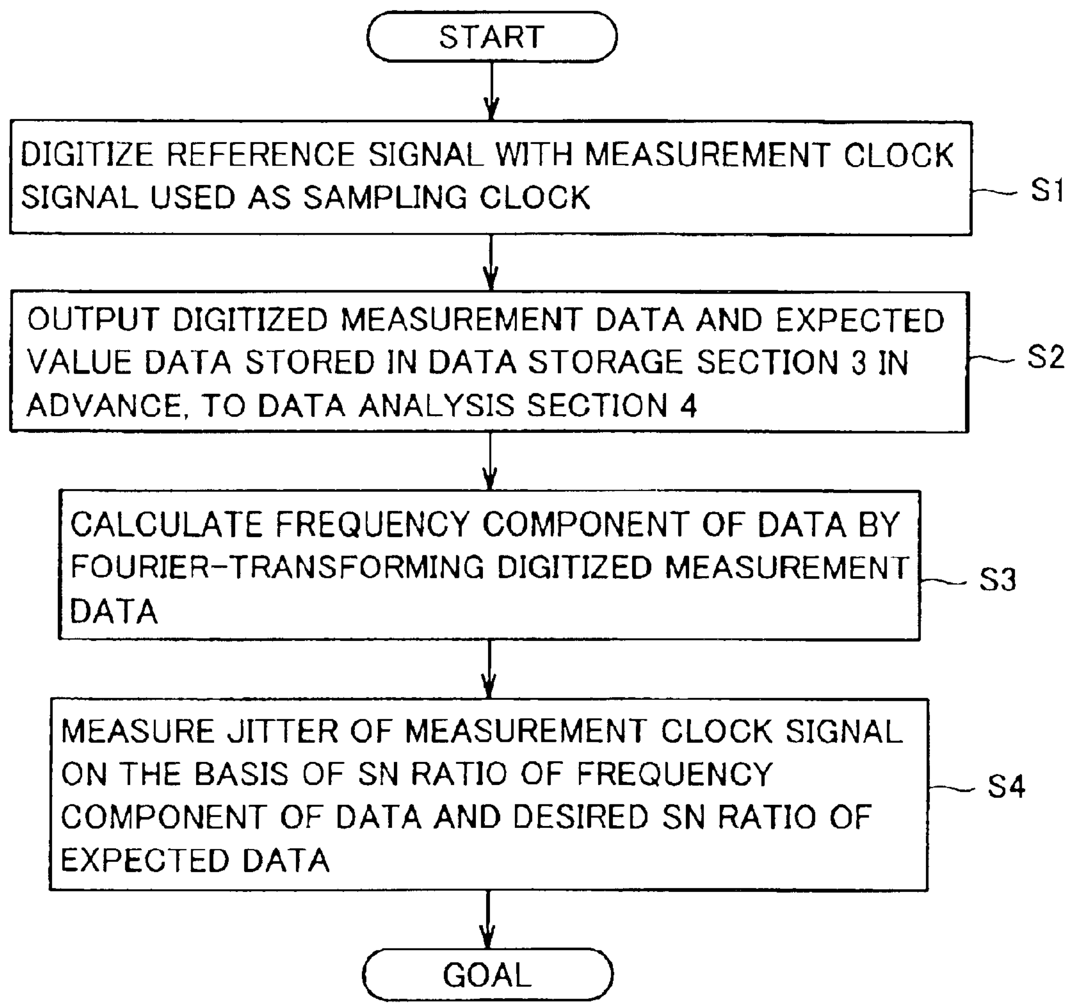
FIG. 2 is a flow chart showing the operation of the jitter measurement circuit according to the first embodiment of the present invention.

With reference to FIGS. 1 and 2, measurement section 2 digitizes the reference signal in accordance with a sampling theorem while using the measurement clock signal, which is the cyclic signal outputted from DUT 5, as a sampling clock (in step S1), and the obtained measurement data is outputted to data storage section 3. In order to satisfy the sampling theorem, the measurement clock signal serving as the sampling signal has frequency not less than twice as high as that of the reference signal.

Next, data storage section 3 outputs the digitized measurement data and ideal expected value data stored in advance, to data analysis section 4 (in step S2).

Data analysis section 4 executes a so-called fast Fourier transform (FFT) for transforming the digitized measurement data from a signal in a time region to a signal in a frequency region, thereby calculating the frequency value, that is, frequency component of the data signal (in step S3).

Next, on the basis of the signal-to-noise ratio (hereinafter, also referred to as "SN ratio") of the frequency component of the data and a desired SN ratio which is the expected value data, data analysis section 4 measures the jitter of the measurement clock signal (in step S4).

Generally, if the SN ratio data analysis is executed using the data obtained by digital conversion, the analysis result of the SN ratio is greatly influenced by the purities of the reference signal and the sampling clock. That is, by inputting a high purity reference signal into a high accuracy analog-to-digital conversion circuit corresponding to measurement section 2, the analysis result is greatly influenced by the purity of the measurement clock signal serving as the sampling clock.

Specifically, if the measurement clock signal serving as the sampling clock has no jitter, a sampling cycle is quite stable. As a result, if FFT analysis is executed, only the frequency component corresponding to the desired cycle of the reference signal appears. Therefore, the SN ratio obtained by the analysis result is high.

On the other hand, if the measurement clock signal serving as the sampling clock has jitter, the sampling cycle becomes irregular. As a result, if FFT analysis is executed, the frequency components corresponding to the cycles other than the desired cycle of the reference signal also appear. Therefore, the SN ratio obtained by the analysis result is low due to the irregular frequencies.

By relatively comparing these results, it is possible to measure jitter level.

By adopting the constitution of the jitter measurement circuit according to the first embodiment, it is possible to simply measure jitter without using an expensive dedicated measuring equipment or an expensive tester having the same function as that of the measuring equipment to thereby reduce cost.

First Modification of First Embodiment

Figure 3:
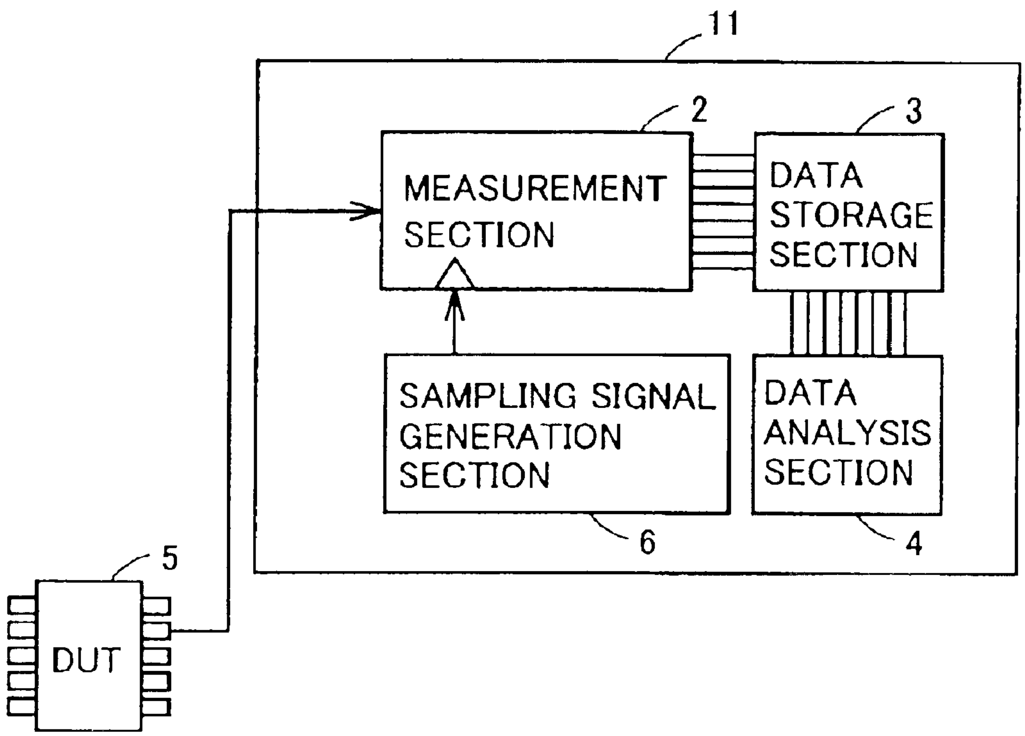
FIG. 3 is a conceptual view of a jitter measurement circuit and a measurement target DUT according to a first modification of the first embodiment of the present invention.

With reference to FIG. 3, a jitter measurement circuit 11 according to a first modification of the first embodiment of the present invention differs from jitter measurement circuit 10 in that the measurement dock signal generated by DUT 5 instead of the reference signal generated by reference signal generation section 1 are inputted into measurement section 2 and that a high purity sampling clock generated by a sampling signal generation section 6 instead of the measurement clock signal generated by DUT 5 is inputted into measurement section 2. Since the other constitutions are equal to those of jitter measurement circuit 10 in the first embodiment shown in FIG. 1, they will not be described herein repeatedly.

Using the flow chart of FIG. 4, the operation of jitter measurement circuit 11 according to the first modification of the first embodiment of the present invention will be described.

Figure 4:
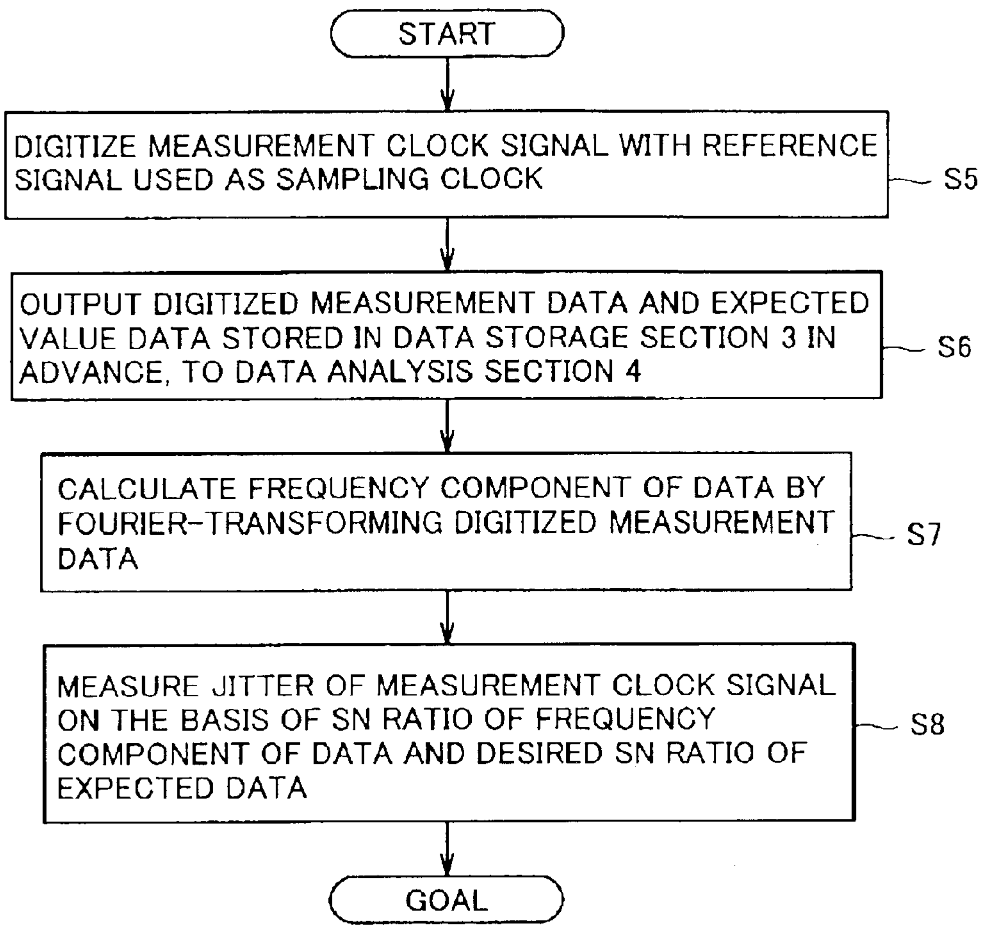
FIG. 4 is a flow chart showing the operation of the jitter measurement circuit according to the first modification of the first embodiment of the present invention.

With reference to FIGS. 3 and 4, measurement section 2 digitizes a measurement clock signal which is a cyclic signal outputted from DUT 5 in accordance with a sampling theorem while using the sampling clock generated by sampling signal generation section 6 as a reference signal (in step S5), and the obtained measurement data is outputted to data storage section 3. In order to satisfy the sampling theorem, the sampling clock has frequency not less than twice as high as that of the reference signal.

Next, data storage section 3 outputs the digitized measurement data and ideal expected value data stored in advance, to data analysis section 4 (in step S6).

Data analysis section 4 executes a so-called fast Fourier transform (FFT) for transforming the digitized measurement data from a signal in a time region to a signal in a frequency region, thereby calculating the frequency component of the data (in step S7).

Next, on the basis of the SN ratio of the frequency component of the data and a desired SN ratio which is the expected value data, data analysis section 4 measures the jitter of the measurement clock signal (in step S8).

In the operation of jitter measurement circuit 11 described above, similarly to that of jitter measurement circuit 10 in the first embodiment, if the SN ratio data analysis is executed using the data obtained by digital conversion, the analysis result of the SN ratio is greatly influenced by the purities of the measurement clock signal and the sampling clock. That is, by inputting a high purity sampling clock into a high accuracy analog-to-digital conversion circuit corresponding to measurement section 2, the analysis result is greatly influenced by the purity of the measurement clock signal.

Specifically, if the measurement clock signal has no jitter, a sampling cycle is constant. As a result, if FFT analysis is executed, only the frequency component corresponding to the desired cycle of the measurement clock signal appears. Therefore, the SN ratio obtained by the analysis result is high.

On the other hand, if the measurement dock signal has jitter, the sampling cycle becomes irregular by the jitter even if a sampling cycle is constant. As a result, if FFT analysis is executed, the frequency components corresponding to the cycles other than the desired cycle of the measurement clock signal also appear. Therefore, the SN ratio obtained by the analysis result is low due to the irregular frequencies.

By relatively comparing these results, it is possible to measure jitter level.

By adopting the constitution of the jitter measurement circuit according to the first modification of the first embodiment, it is possible to simply measure jitter without using an expensive dedicated measuring equipment or an expensive tester having the same function as that of the measuring equipment, and to thereby reduce cost.

Second Embodiment

In the first embodiment, the constitution in which DUT 5 as a measurement target is directly measured by the jitter measurement circuit, has been described. In a second embodiment, the constitution of a semiconductor testing device which has functions according to the jitter measurement method shown in the first embodiment will be described.

Figure 5:
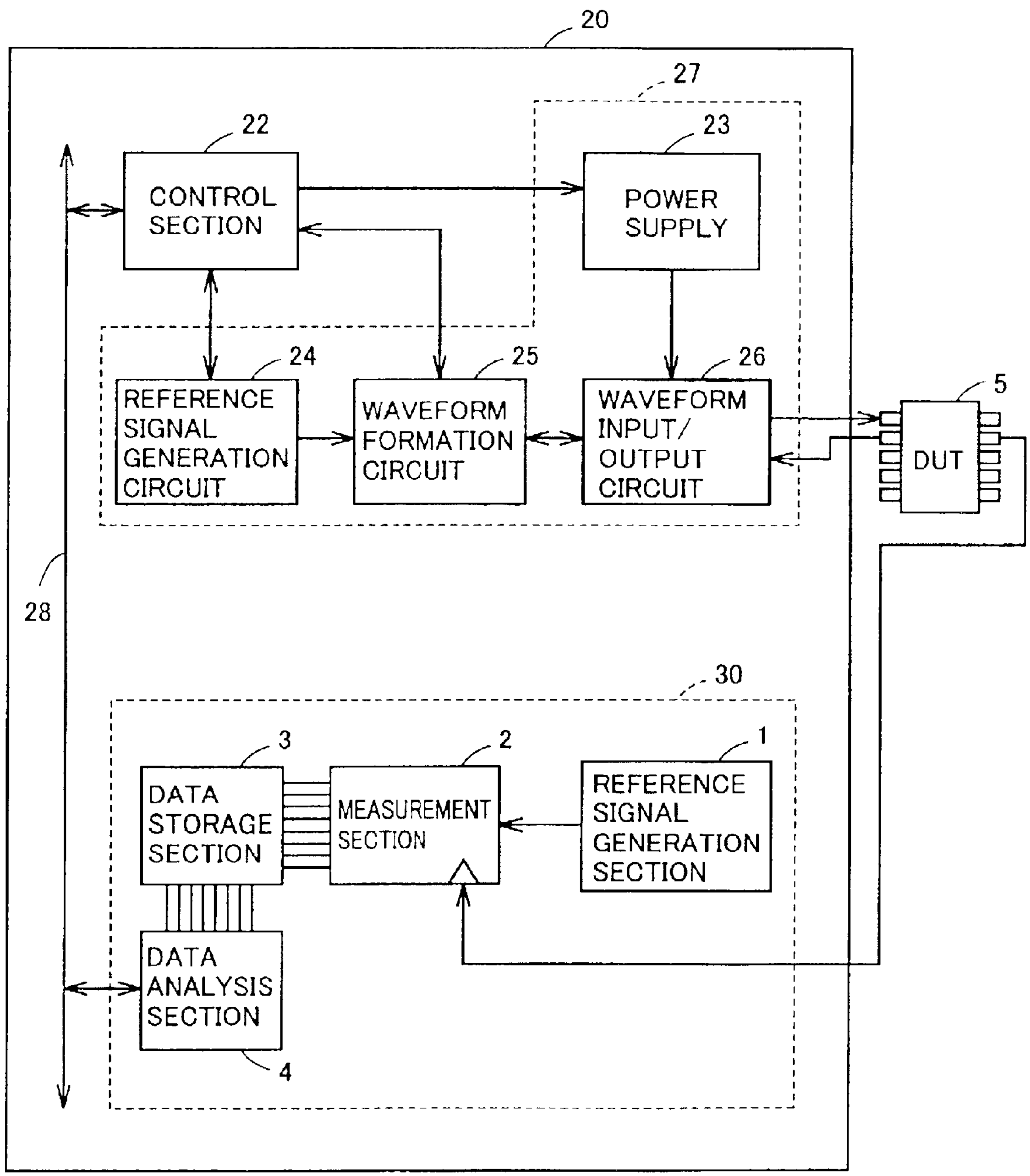
FIG. 5 is a conceptual view of a semiconductor testing device and a measurement target DUT according to a second embodiment of the present invention.

With reference to FIG. 5, a semiconductor testing device 20 according to the second embodiment of the present invention includes: a control section 22 which controls overall semiconductor testing device 20; an internal bus 28 which transmits and receives data to and from an internal circuit; a test signal generation section 27 which executes the input/output of a test signal to and from measurement target DUT 5; and a jitter measurement section 30 which executes the measurement of the jitter of measurement target DUT 5.

Test signal generation section 27 is intended to input a test signal having a specific pattern into measurement target DUT 5 and to determine whether DUT 5 is good or bad on the basis of a responsive output signal.

Test signal generation section 27 includes: a reference signal generation circuit 24 which generates a reference signal which is a certain cyclic signal; a waveform formation circuit 25 which forms a test signal in response to an instruction from control section 22; a waveform input/output circuit 26 which adjusts the amplitude of the test signal and outputs the resultant test signal to the measurement target; and a power supply 23 which supplies voltage to adjust the amplitude of the test signal in response to the instruction from control section 22. Further, waveform input/output circuit 26 receives the input of a signal from the measurement target. Accordingly, waveform formation circuit 25 receives a signal from waveform input/output circuit 26 and outputs signal data to control section 22.

A test performed in accordance with test signal generation section 27 will be described.

Reference signal generation circuit 24 generates the reference signal in response to the instruction from control section 22. Waveform formation circuit 25 generates the test signal on the basis of a specific test pattern from the reference signal in response to the instruction from control section 22. Waveform input/output circuit 26 adjusts the amplitude of the test signal outputted from waveform formation circuit 25, and inputs the resultant test signal into measurement target DUT 5. DUT 5 outputs the output signal to test signal generation section 27 in response to the input of the test signal. Waveform formation circuit 25 outputs data on the inputted output signal to control section 22 to subject the output signal to analysis. By way of example, it is possible to perform a test which determines that DUT 5 is good if a test signal having a specific pattern is inputted and an output signal having the same pattern is obtained.

Jitter measurement section 30 includes reference signal generation section 1, measurement section 2, data storage section 3 and data analysis section 4. Jitter measurement section 30 is equal in constitution to jitter measurement circuit 10 described in the first embodiment. Therefore, the connection relationship, operation and the like of jitter measurement section 30 will not be repeatedly described herein. Thus, jitter measurement section 30 can execute the measurement of the jitter of the measurement clock signal outputted from DUT 5.

Further, the result analyzed by data analysis section 4 is transmitted to control section 22 through internal bus 28.

By including jitter measurement section 30 capable of executing jitter measurement in a semiconductor testing device as seen in the semiconductor testing device according to the present invention, it is possible to simply execute the jitter measurement at low cost even in the semiconductor testing device.

Furthermore, since data is transmitted and received between control section 22 and data analysis section 4 through internal bus 28, it is possible to accelerate the jitter measurement to be executed and to thereby reduce testing time.

First Modification of Second Embodiment

Figure 6:
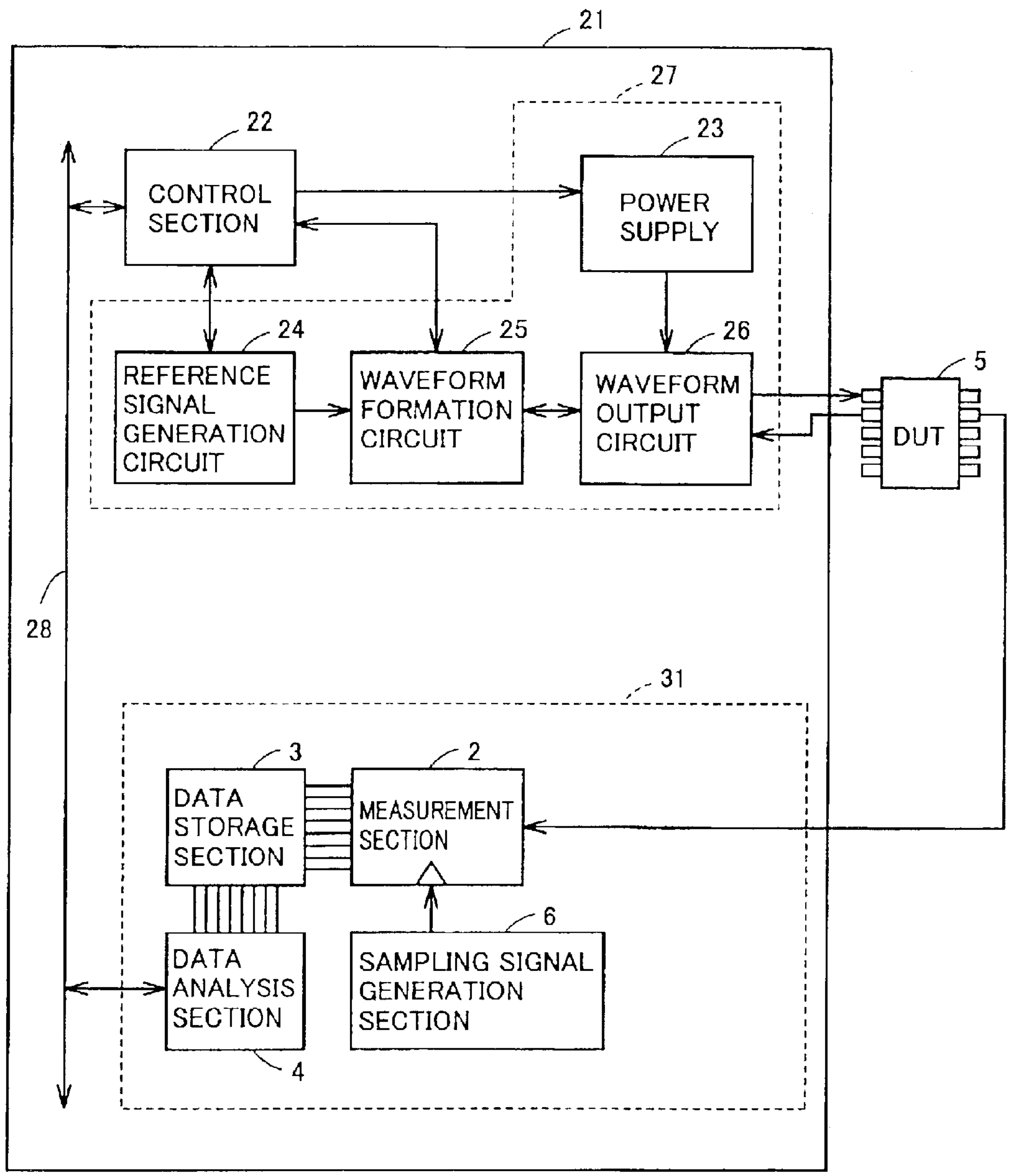
FIG. 6 is a conceptual view of a semiconductor testing device and a measurement target DUT according to a first modification of the second embodiment of the present invention.

With reference to FIG. 6, a semiconductor testing device 21 according to a first modification of the second embodiment of the present invention differs from semiconductor testing device 20 shown in FIG. 5 in that jitter measurement section 30 is replaced by a jitter measurement section 31.

Since Jitter measurement section 31 is equal in constitution to jitter measurement circuit 11 according to the first modification of the first embodiment shown in FIG. 3, the connection relationship, the operation and the like of jitter measurement section 31 will not be repeatedly described herein. Thus, jitter measurement section 31 can execute the measurement of the jitter of the measurement clock signal outputted from DUT 5.

By including jitter measurement section 31 in the semiconductor testing device as seen in the constitution of the present invention, it is possible to attain the same advantages as those of the second embodiment described above.

Second Modification of Second Embodiment

Figure 7:
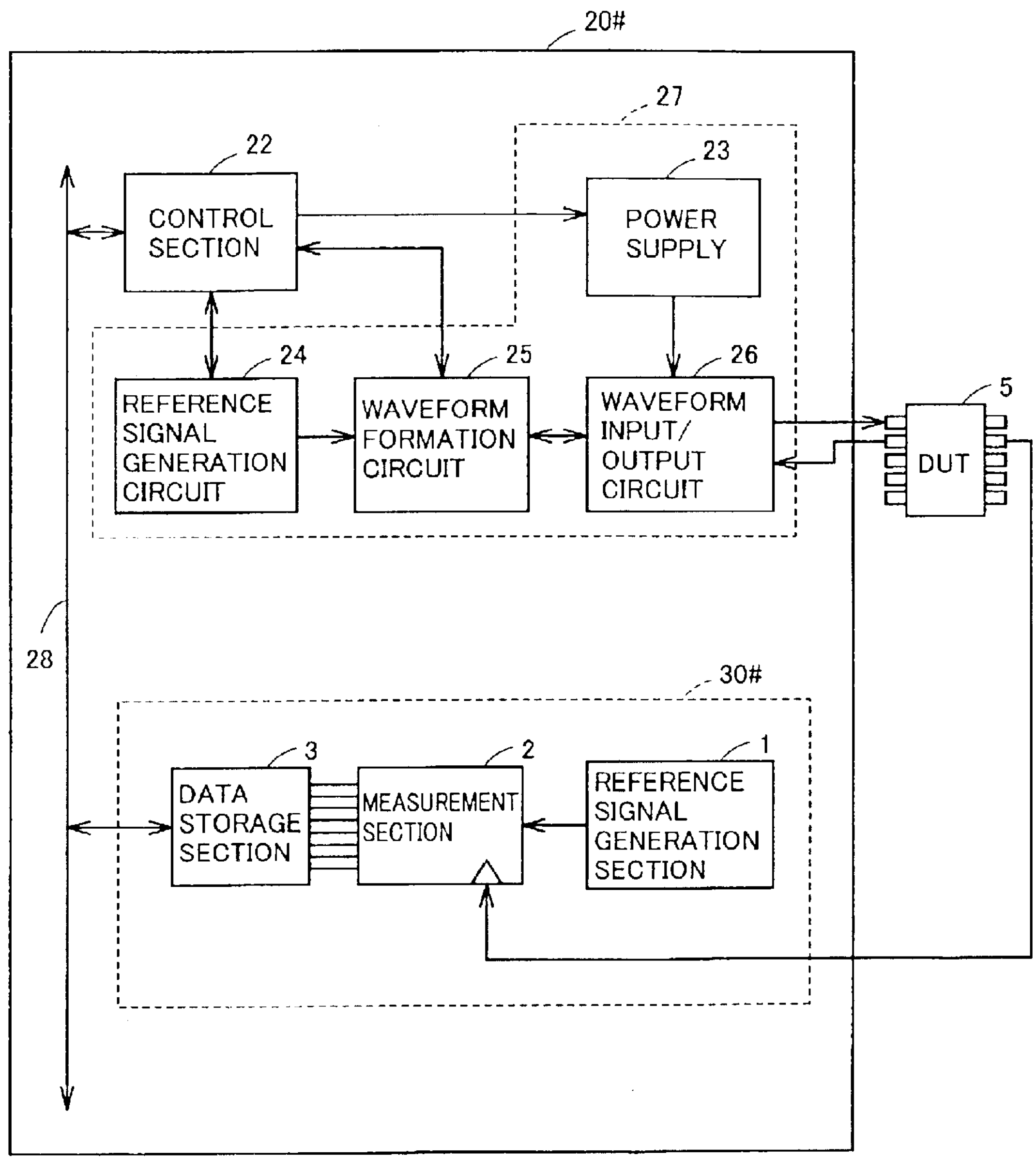
FIG. 7 is a conceptual view of a semiconductor testing device and a measurement target DUT according to a second modification of the second embodiment of the present invention.

With reference to FIG. 7, a semiconductor testing device 20# according to a second modification of the second embodiment of the present invention differs from semiconductor testing device 20 shown in FIG. 5 in that jitter measurement section 30 is replaced by a jitter measurement section 30#.

Jitter measurement section 30# differs from jitter measurement section 30 in that data analysis section 4 is eliminated. Since the other constitutions are equal to those of jitter measurement section 30, they will not be repeatedly described herein.

Semiconductor testing device 20# according to the second modification of the second embodiment is intended to analyze data obtained by jitter measurement section 30# using control section 22. Specifically, the data is inputted into control section 22 from data storage section 3 through internal bus 28, and control section 22 analyzes the data to measure jitter.

By eliminating data analysis section 4 and allowing control section 22 to execute the same function as that of data analysis section 4 as seen in the constitution of semiconductor testing device 20# according to the second modification of the second embodiment, it is possible to not only attain the same advantages as those of the second embodiment, but also further decrease the number of parts and thereby further reduce cost.

Third Modification of Second Embodiment

Figure 8:
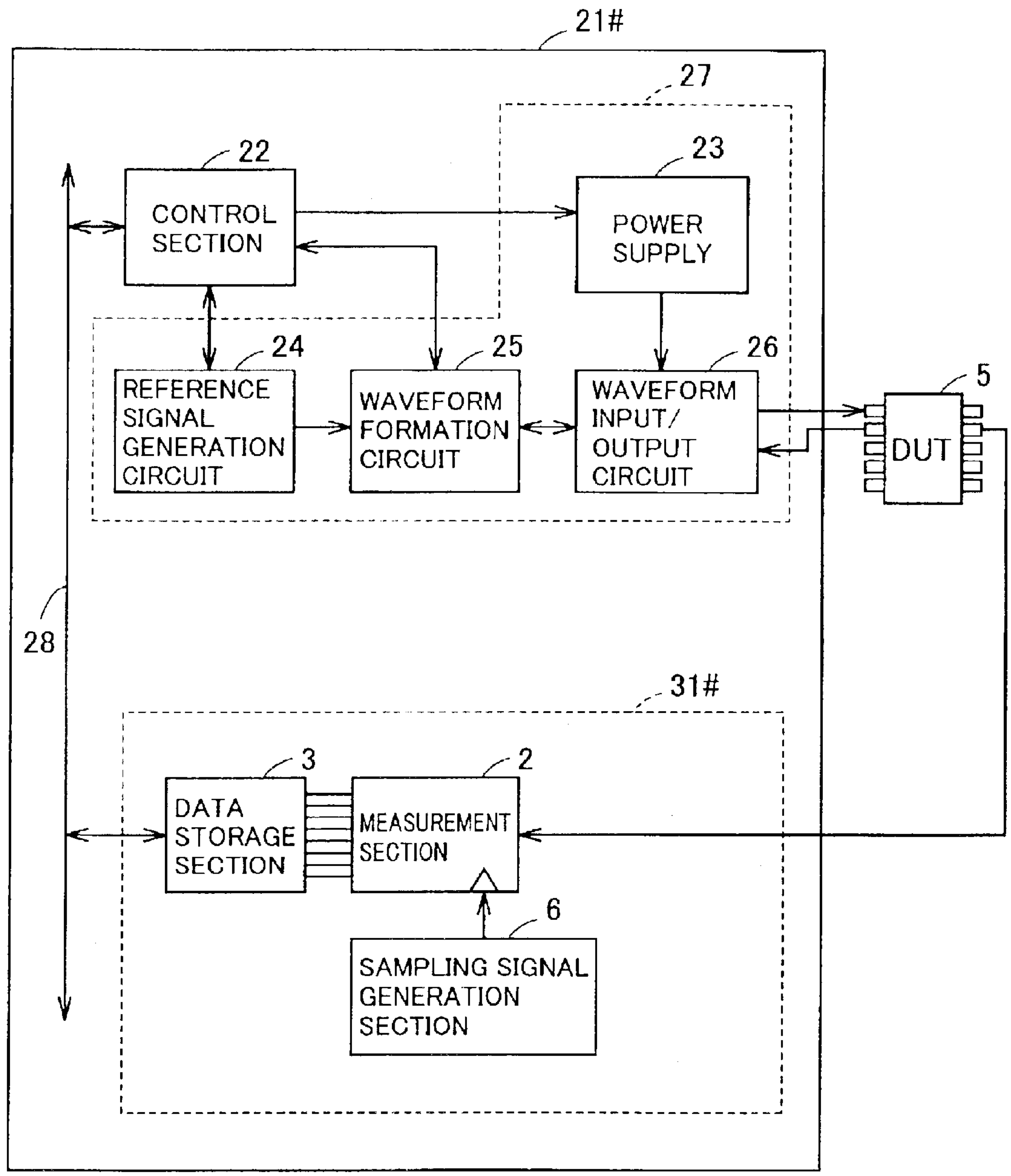
FIG. 8 is a conceptual view of a semiconductor testing device and a measurement target DUT according to a third modification of the second embodiment of the present invention.

With reference to FIG. 8, a semiconductor testing device 21# according to a third modification of the second embodiment of the present invention differs from semiconductor testing device 21 shown in FIG. 6 in that jitter measurement section 31 is replaced by a jitter measurement section 31#.

Jitter measurement section 31# differs from jitter measurement section 31 in that data analysis section 4 is eliminated. Since the other constitutions are equal to those of jitter measurement section 31, they will not be repeatedly described herein.

Semiconductor testing device 21# according to the third modification of the second embodiment is intended to analyze data obtained by jitter measurement section 31# using control section 22. Specifically, the data is inputted into control section 22 from data storage section 3 through internal bus 28, and control section 22 analyzes the data to measure jitter.

By eliminating data analysis section 4 and allowing control section 22 to execute the same function as that of data analysis section 4 as seen in the constitution of semiconductor testing device 21# according to the third modification of the second embodiment, it is possible to not only attain the same advantages as those of the second embodiment, but also further decrease the number of parts and thereby further reduce cost.

Fourth Modification of Second Embodiment

Figure 9:
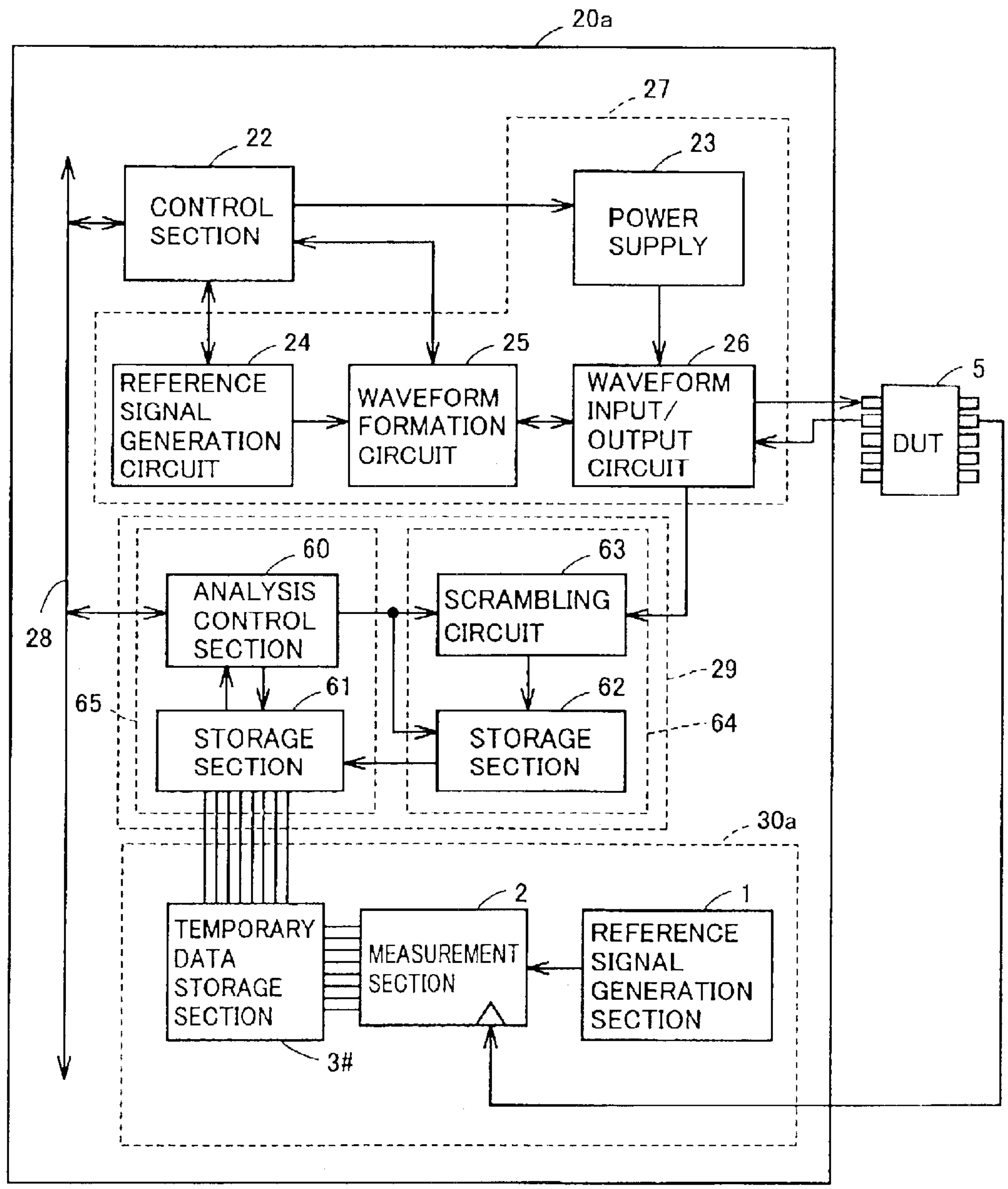
FIG. 9 is a conceptual view of a semiconductor testing device and a measurement target DUT according to a fourth modification of the second embodiment of the present invention.

With reference to FIG. 9, a semiconductor testing device 20*a* according to a fourth modification of the second embodiment of the present invention differs from semiconductor testing device 20# shown in FIG. 7 in that jitter measurement section 30# is replaced by a jitter measurement section 30*a* and that a repair analysis functional section 29 is further provided.

Repair analysis functional section 29 detects and analyzes a defect in a memory if the memory is included in measurement target DUT 5.

Repair analysis functional section 29 includes: an error catch section 64 which detects a data signal indicating a defect in the memory; and an analysis section 65 which analyzes the inputted data signal.

Error catch section 64 includes: a scrambling circuit 63 which receives a data signal inputted from waveform input/output circuit 26 and executes a logical operation; and a storage section 62 which stores the logical operation result of scrambling circuit 63.

Analysis section 65 includes: an analysis control section 60 which analyzes the defect in the memory on the basis of information stored in a storage section 61; and storage section 61 which stores information outputted from storage section 62 so as to analyze input data in response to an instruction from analysis control section 60 and stores the analysis result of analysis control section 60.

The operation when analyzing a defect will be described.

In a mode for executing a defect analysis, control section 22 outputs a predetermined test signal to DUT 5 using test signal generation section 27. In response to the predetermined test signal, a data signal for defect information on an address or the like in the memory is outputted from DUT 5 to waveform input/output circuit 26. Waveform input/output circuit 26 transmits the data signal outputted from DUT 5 in the defect analysis execution mode, to repair analysis functional section 29. Accordingly, repair analysis functional section 29 executes a defect analysis.

Jitter measurement section 30*a* differs from jitter measurement section 30# in that data storage section 3 is replaced by a temporary data storage section 3#. Since the other constitutions are equal to those of jitter measurement section 30#, they will not be repeatedly described herein.

The fourth modification of the second embodiment of the present invention is intended to store the data or the like, which is stored in jitter measurement section 30*a*, in storage section 61 provided in repair analysis functional section 29.

Specifically, the data obtained in measurement section 2 is outputted to repair analysis functional section 29 through temporary storage section 3#, and data necessary for the analysis is transferred from storage section 61 to control section 22 through internal bus 28.

With the constitution of the fourth modification, the data which is stored in data storage section 3 provided in jitter measurement section, is stored in the storage section of the repair analysis functional section 29 which has the other testing function, whereby it is possible to not only attain the same advantages as those of the second embodiment, but also further decrease the number of parts and thereby further reduce cost.

In jitter measurement section 30*a* according to the fourth modification of the second embodiment, temporary storage section 3# is provided so as to contribute to the acceleration of data transfer rate. It is also possible not to provide temporary storage section 3#.

Further, the constitution, in which the data or the like necessary for the jitter measurement section is stored in storage section 61, has been described herein. Alternatively, a constitution in which the necessary data or the like is stored in storage section 62 instead of storage section 61 may be adopted. In addition, the necessary data may be stored in a storage region provided in a circuit section or the like having the other testing function instead of the storage section of repair analysis functional section 29.

Fifth Modification of Second Embodiment

Figure 10:
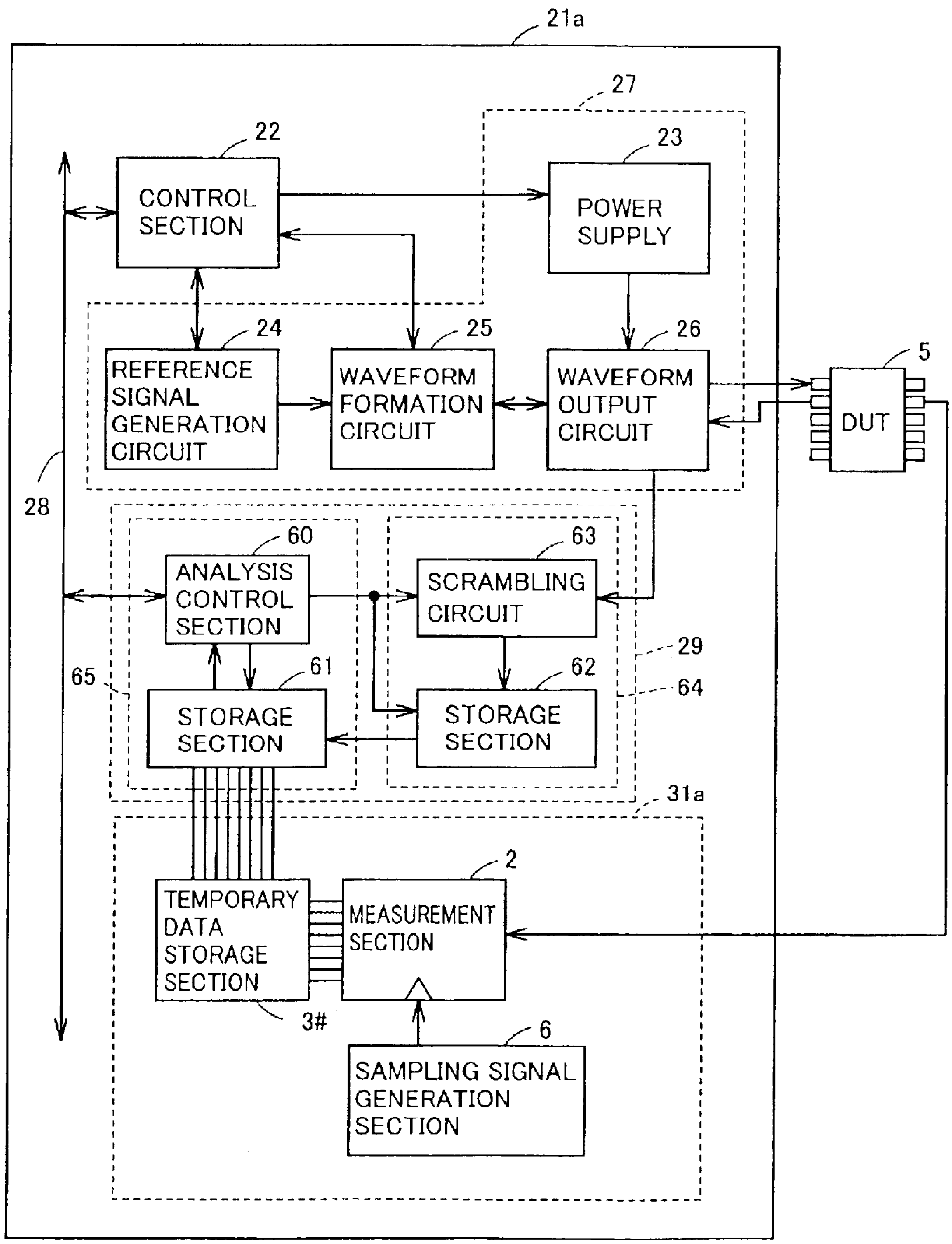
FIG. 10 is a conceptual view of a semiconductor testing device and a measurement target DUT according to a fifth modification of the second embodiment of the present invention.

With reference to FIG. 10, a semiconductor testing device 21*a* according to a fifth modification of the second embodiment of the present invention differs from semiconductor testing device 21# shown in FIG. 8 in that jitter measurement section 31# is replaced by a jitter measurement section 31*a* and that repair analysis functional section 29 is further provided.

Jitter measurement section 31*a* differs from jitter measurement section 31# in that data storage section 3 is replaced by temporary storage section 3#. Since the other constitutions are equal to those of jitter measurement section 31#, they will not be repeatedly described herein.

The fifth modification of the second embodiment of the present invention is intended to store the data or the like, which is stored in jitter measurement section 31*a*, in storage section 61 provided in repair analysis functional section 29.

Specifically, the data obtained in measurement section 2 is outputted to repair analysis functional section 29 through temporary storage section 3#, and data necessary for the analysis is transferred from storage section 61 to control section 22 through internal bus 28.

With the constitution of the fifth modification, the data which is stored in data storage section 3 provided in the jitter measurement section, is stored in the storage section of repair analysis functional section 29 which has the other a testing function, whereby it is possible to not only attain the same advantages as those of the second embodiment, but also further decrease the number of parts and thereby further reduce cost.

In jitter measurement section 31*a* according to the fifth modification of the second embodiment, temporary storage section 3# is provided so as to contribute to the acceleration of data transfer rate. It is also possible not to provide temporary storage section 3#.

Further, the constitution in which the data or the like necessary for the jitter measurement section is stored in storage section 61 has been described herein. Alternatively, a constitution in which the necessary data or the like is stored in storage section 62 instead of storage section 61 may be adopted. In addition, the necessary data may be stored in a storage region provided in a circuit section or the like having the other testing function instead of the storage section of repair analysis functional section 29.

In the second embodiment and the modifications of the second embodiment, the constitution in which the jitter testing section executing jitter measurement is included in the semiconductor testing device, has been described. Conversely, the jitter testing circuit described in the first embodiment and the modification of the first embodiment may be constituted to include the above-described testing function which the semiconductor testing device has.

Third Embodiment

A third embodiment of the present invention is intended to provide a circuit which functions to be capable of executing the above-described jitter measurement, in a device interface board.

Figure 11:
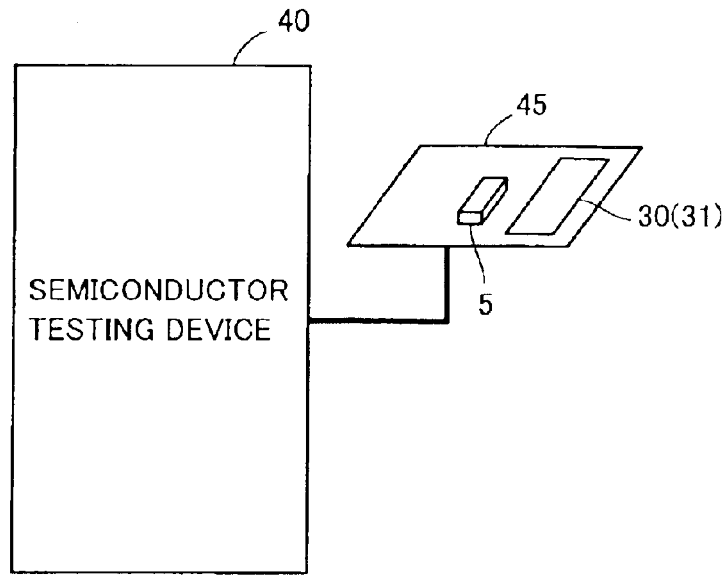
FIG. 11 is a conceptual view of a device interface board and a semiconductor testing device according to a third embodiment of the present invention.

With reference to FIG. 11, a device interface board 45 according to the third embodiment of the present invention includes measurement target DUT 5 and jitter measurement section 30.

A semiconductor testing device 40 is electrically connected to device interface board 45, and executes a desired test to measurement target DUT 5.

Further, semiconductor testing device 40 executes jitter measurement using jitter measurement section 30 provided in device interface board 45.

By incorporating jitter measurement section 30 into a board as seen in the constitution of the device interface board according to the third embodiment of the present invention, it is possible to execute the same measurement even if the jitter measurement section is not included in the semiconductor testing device as described in the second embodiment.

In the third embodiment, the constitution of device interface board 45 in which jitter measurement section 30 is employed has been described. The present invention is also applicable to the constitution of an device interface board in which jitter measurement section 31 instead of jitter measurement section 30 is employed.

Moreover, since the device interface board can be manufactured at relatively low cost, it is possible to manufacture boards each having the jitter measurement function in large volume at low cost.

Furthermore, since the device interface board can be utilized as it is for the other semiconductor testing device, not shown, the present invention is advantageously efficient.

Fourth Embodiment

In a fourth embodiment according to the present invention, a constitution in which the above-described jitter measurement section is provided in a semiconductor device will be described.

Figure 12:
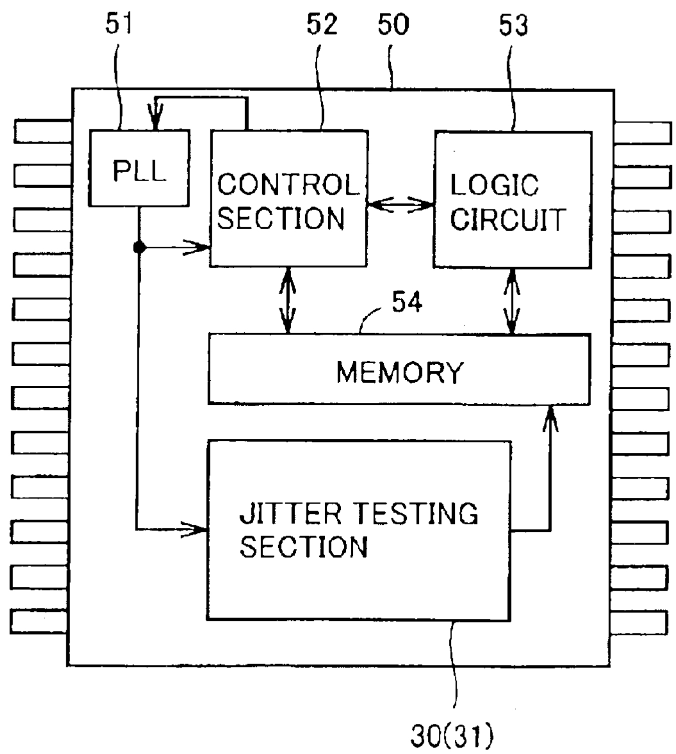
FIG. 12 is a conceptual view of a semiconductor device according to a fourth embodiment of the present invention.

With reference to FIG. 12, a semiconductor device 50 according to the fourth embodiment of the present invention includes: a PLL 51 (Phase Locked Loop) which generates an internal clock signal synchronized with a clock signal inputted from the outside of semiconductor device 50 and used in an internal circuit; a control section 52 which controls overall semiconductor device 50; a logic circuit 53 which is controlled by control section 52 and executes a desired logic operation; a memory 54 which stores data; and jitter measurement section 30 which executes jitter measurement.

The operation of jitter measurement section 30 will be described.

Jitter measurement section 30 receives the input of the internal clock signal generated by PLL 51, executes the measurement of the jitter of the internal clock signal, and stores an analysis result in memory 54. Control section 52 instructs PLL 51 to generate an internal clock signal which has small jitter on the basis of the analysis result stored in memory 54.

By providing the jitter measurement section in the semiconductor device as seen in this constitution, it is possible to measure the jitter level of the internal clock signal and to correct the internal clock signal.

In this embodiment, the constitution of measuring the jitter level of the internal clock signal and correcting the internal clock signal has been described. Alternatively, a constitution in which a measured value on the basis of the analysis result is outputted to the outside of the semiconductor device may be adopted.

Further, in this embodiment, jitter measurement section 30 executing the measurement of the jitter of the internal clock signal has been described. However, the measurement target is not limited to the internal clock signal but the jitter measurement section can execute the measurement of the jitter of the other signal.

Moreover, the constitution of semiconductor device 50 in which jitter measurement section 30 is provided has been described. The present invention is also applicable to the constitution of a semiconductor device in which jitter measurement section 31 is provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A jitter measurement circuit comprising:

a reference signal generation section generating a cyclic reference signal having a predetermined cycle;

a conversion section sampling one of the cyclic reference signal and a cyclic measurement target signal output from a measurement target in response to each other, thereby obtaining a sampling data string; and a determination section measuring jitter of the cyclic measurement target signal based on the sampling data string obtained by said conversion section, wherein said determination section measures the jitter based on a frequency component of a data signal obtained from the sampling data string and calculates the frequency component of the data signal by subjecting the sampling data string to a fast Fourier transform.

2. The jitter measurement according to claim 1, further comprising:

a testing section executing a determination test; and a control section controlling said testing section, wherein said control section operates as said determination section in measuring the jitter.

3. The jitter measurement circuit according to claim 1, further comprising a storage section storing data, wherein said storage section stores data used in a measurement by said determination section, in advance.

4. The jitter measurement circuit according to claim 3, further comprising a testing section executing a determination test, wherein said storage section further stores data used in said testing section.

5. A jitter measurement circuit comprising:

a reference signal generation section generating a cyclic reference signal having a predetermined cycle;

a conversion section sampling one of the cyclic reference signal and a cyclic measurement target signal output from a measurement target in response to each other, thereby obtaining a sampling data string; and a determination section measuring jitter of the cyclic measurement target signal based on the sampling data string obtained by said conversion section, wherein said determination section measures the jitter, based on a frequency component of a data signal obtained from the sampling data string, by comparing signal-to-noise ratio obtained from the frequency component of the data signal with a desired signal-to-noise ratio.

6. The jitter measurement according to claim 5, further comprising:

a testing section executing a determination test; and a control section controlling said testing section, wherein said control section operates as said determination section in measuring the jitter.

7. The jitter measurement circuit according to claim 5, further comprising a storage section storing data, wherein said storage section stores data used in a measurement by said determination section, in advance.

8. The jitter measurement circuit according to claim 7, further comprising a testing section executing a determination test, wherein said storage section further stores data used in said testing section.

* * * * *